United States Patent
Lee et al.

(10) Patent No.: US 10,008,445 B2
(45) Date of Patent: Jun. 26, 2018

(54) EMBEDDED FUSE WITH CONDUCTOR BACKFILL

(71) Applicant: Intel Corporation, Santa Clara, CA (US)

(72) Inventors: Chen-Guan Lee, Hillsboro, OR (US); Walid M. Hafez, Portland, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/110,704

(22) PCT Filed: Feb. 11, 2014

(86) PCT No.: PCT/US2014/015815
§ 371 (c)(1),
(2) Date: Jul. 8, 2016

(87) PCT Pub. No.: WO2015/122877
PCT Pub. Date: Aug. 20, 2015

(65) Prior Publication Data
US 2016/0329282 A1      Nov. 10, 2016

(51) Int. Cl.
| | |
|---|---|
| H01L 29/78 | (2006.01) |
| H01L 21/768 | (2006.01) |
| H01L 27/06 | (2006.01) |
| H01L 21/8234 | (2006.01) |
| H01L 23/525 | (2006.01) |
| H01L 27/112 | (2006.01) |
| H01L 29/66 | (2006.01) |

(52) U.S. Cl.
CPC ...... *H01L 23/5256* (2013.01); *H01L 23/5252* (2013.01); *H01L 27/11206* (2013.01);
(Continued)

(58) Field of Classification Search
CPC ......... H01L 2924/0002; H01L 2924/00; H01L 23/5252; H01L 23/5256; H01L 27/11206; H01L 29/66545; H01L 21/76877
(Continued)

(56) References Cited

U.S. PATENT DOCUMENTS 5,464,790 A    11/1995  Hawley
2011/0012629 A1*  1/2011  Chakravarti ........ H01L 23/5252
                                                   324/713
(Continued)

FOREIGN PATENT DOCUMENTS

KR    20100100398    9/2010
TW     201007824    2/2010

OTHER PUBLICATIONS

International Preliminary Report on Patentability for PCT Patent Application No. PCT/US14/15815, dated Aug. 25, 2016, 10 pages.
(Continued)

*Primary Examiner* — Marcos D Pizarro
*Assistant Examiner* — Nelson Garces
(74) *Attorney, Agent, or Firm* — Green, Howard & Mughal LLP (57) ABSTRACT

Embedded fuse structures and fabrication techniques. An embedded fuse may include a non-planar conductive line having two high-z portions extending to a greater z-height than a low-z portion of reduced current carrying capability disposed there between. A dielectric disposed over the low-z portion has a top surface planar with the high-z line portions to which fuse contacts may be landed. Fabrication of an embedded fuse may include undercutting a region of a first dielectric material disposed over a substrate. The undercut region is lined with a second dielectric material. A pair of electrically joined fuse ends are formed by backfilling the lined undercut region with a conductive material. In advantageous embodiments, fuse fabrication is compatible with high-K, metal gate transistor and precision polysilicon resistor fabrication flows.

19 Claims, 9 Drawing Sheets

(52) U.S. Cl.
CPC .. *H01L 29/66545* (2013.01); *H01L 21/76877* (2013.01); *H01L 2924/0002* (2013.01)

(58) Field of Classification Search
USPC .................................................. 257/374–384
See application file for complete search history.

(56) References Cited

U.S. PATENT DOCUMENTS

| | | |
|---|---|---|
| 2012/0146179 A1 | 6/2012 | Lee et al. |
| 2012/0196434 A1 | 8/2012 | Thei et al. |
| 2012/0248567 A1 | 10/2012 | Hsu et al. |
| 2013/0134519 A1* | 5/2013 | Sengoku ............ H01L 23/5256 |
| | | 257/364 |

OTHER PUBLICATIONS

International Search Report and Written Opinion for PCT Patent Application No. PCT/US14/15815, dated Nov. 12, 2014, 15 pages.
Notice of Allowance for Taiwan Patent Application No. 104100380 dated Aug. 3, 2016, 2 pages—No Translation Available.
Office Action and Search Report for Taiwan Patent Application No. 104100380 dated Dec. 21, 2015, 9 pages.
Office Action for Vietnamese Patent Application No. 1-2016-02538 dated Nov. 17, 2016, 2 pages.

* cited by examiner

EMBEDDED FUSE WITH CONDUCTOR BACKFILL

CLAIM OF PRIORITY

This application claims priority to PCT Patent Application Serial No. PCT/US2014/015815, filed on 11 Feb. 2014 and titled "EMBEDDED FUSE WITH CONDUCTOR BACKFILL", which is incorporated by reference in its entirety.

TECHNICAL FIELD

Embodiments of the invention generally relate to fabrication of integrated circuits (ICs) and monolithic devices, and more particularly pertain to monolithic fuses.

BACKGROUND

Monolithic ICs generally comprise a number of transistors, such as metal-oxide-semiconductor field-effect transistors (MOSFETs) fabricated over a planar substrate, such as a silicon wafer.

ICs often include at least one fuse. A fuse is a sacrificial device to provide overcurrent protection, security, or programmability. A fuse starts with a low electrical resistance and is designed to permanently create a non-conductive path when the current across the device exceeds a certain level.

Some conventional fuse designs employ a thin interconnect metal line. If a high enough current is passed through the thin metal line, the line melts and creates an open circuit. To have a low program current, the cross-section of the fuse needs to be small compared to other circuit conductors. Another fuse design leverages electromigration between two metal materials. When two or more conducting metals interface, momentum transfer between conduction electrons and metal ions can be made large where there is a non-uniform metal ion lattice structure. Above a certain current level, atoms move and create voids near the bimetal interface, thus creating open circuit. In such a fuse design, the overlap area between metals and the electromigration properties of the metals determine the fuse program current.

With MOS transistor dimensions scaling from one technology generation to the next, it is also desirable to scale down fuse size, as well as fuse program current. However, fuse architectures typically rely on less critical lithographic patterning capability than is employed for the smallest MOS transistor structures, and so have not been on the same scaling trajectory as the MOS transistor. Fuse architectures dependent on a bimetal overlap area are typically also limited by lithographic patterning (e.g., overlay) capability. Furthermore, fuse architectures reliant on electromigration are generally incompatible with efforts to mitigate electromigration for sake of improve device reliability.

Fuse architectures and associated fabrication techniques capable of lower program currents, and/or smaller fuse areas are therefore advantageous for advanced MOS ICs.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Terms such as "upper" and "lower" "above" and "below" may be understood by reference to illustrated X-Z coordinates, and terms such as "adjacent" may be understood by reference to X,Y coordinates or to non-Z coordinates. Therefore, the following detailed description is not to be taken in a limiting sense and the scope of claimed subject matter is defined solely by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Embedded fuses with conductor backfill and the fabrication of such fuses are described below. In an embodiment, a monolithic embedded fuse includes a non-planar conductive line disposed over a substrate. The non-planar line has a low-z portion between two high-z portions that extend a greater z-height from the substrate than the low-z portion. A first dielectric material is disposed between the line and the substrate. The dielectric material may be a high-k material and wrap around at least one sidewall of the low-z portion. Another dielectric material is disposed over the first dielectric material and the low-z portion. This overlying dielectric may have a top surface planar with the high-z portions that provide lands for fuse contacts.

Fabrication of an embedded fuse may include undercutting a first (upper) dielectric material that is disposed over a substrate. A conductive material backfills the undercut region. In certain such embodiments, the undercut region is first lined with another dielectric material, and then the conductive material backfills the dielectric-lined undercut region. For advantageous CMOS embodiments, the embedded fuse employs a transistor gate electrode metal as the conductive backfill material and a gate dielectric material completely surrounds the backfilled metal. Fuse fabrication is then compatible with high-K/metal-gate transistor and precision polysilicon resistor fabrication flows. Precision patterning of a sacrificial material may be employed to control dimensions of the backfilled metal.

Figure 1A:
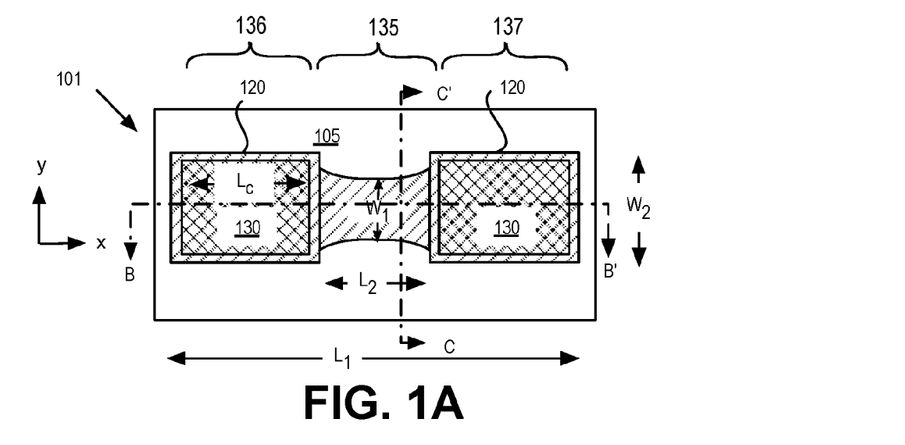
FIG. 1A is a plan view of an embedded fuse with conductor backfill, in accordance with an embodiment.
Figure 1B:
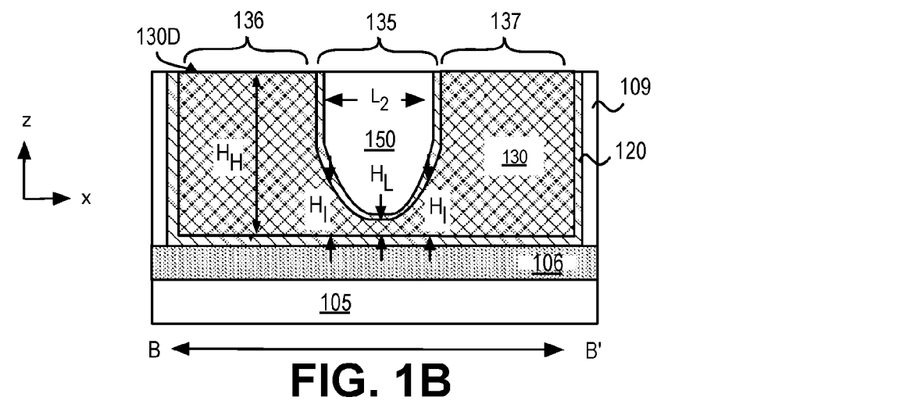
FIGS. 1B and 1C are cross-sectional views of the embedded fuse illustrated in FIG. 1A, in accordance with embodiments.
Figure 1C:
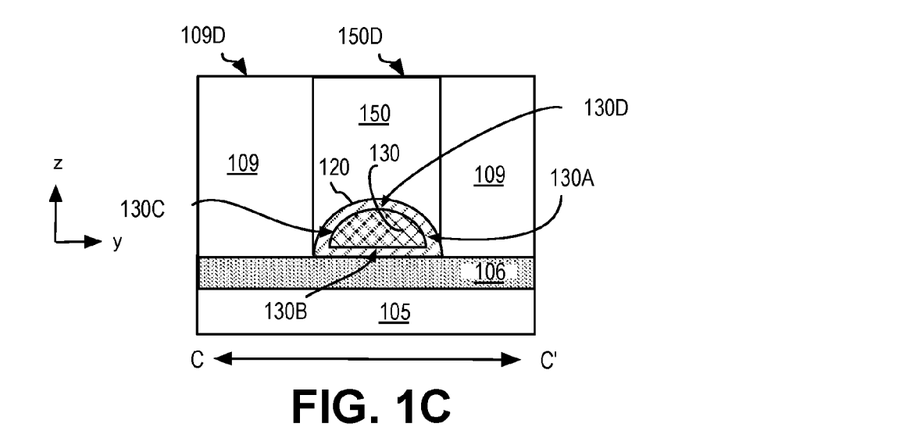

FIG. 1A is a plan view of an embedded fuse 101, in accordance with one such embodiment. FIG. 1B is a cross-sectional view of fuse 101 along the longitudinal B-B' line illustrated in FIG. 1A, in accordance with an embodiment. FIG. 1C is a cross-sectional view of fuse 101 along the transverse C-C' line illustrated in FIG. 1A, in accordance with an embodiment. Reference numbers are the same in FIGS. 1A-1C as the figures represent different views of the same structural embodiment.

As shown in FIG. 1A, an area of a substrate 105 is covered by a fuse trace or line 130. Substrate 105 may be any substrate suitable for forming an IC, such as, but not limited to, a semiconductor substrate, semiconductor-on-insulator (SOI) substrate, or an insulator substrate (e.g., sapphire), or the like, and/or combinations thereof. In one exemplary embodiment, substrate 105 comprises a substantially monocrystalline semiconductor, such as, but not limited to, silicon. Exemplary semiconductor compositions also include group IV systems, such as silicon, germanium, or an alloy thereof; group systems, such as GaAs, InP, InGaAs, and the like; or group III-N systems, such as GaN. As further illustrated in FIG. 1B, substrate 105 may include an isolation dielectric material 106 within the area occupied by fuse line 130. Dielectric material 106 may be any material, such as silicon dioxide or silicon nitride, of a thickness sufficient to electrically isolate fuse line 130 from a well ground and/or prevent electrical shorts through substrate 105. In alternative embodiments, dielectric material 106 may be absent with only a dielectric material 120 separating fuse line 130 from semiconductor of substrate 105. For such an embodiment, a three terminal, multi-function programming device may be provided that can function as a fuse in a first mode, and an antifuse that breaks down dielectric material 120 in a second mode. Fuse operation may be provided through application of a fuse programming voltage across opposite ends of fuse line 130. For a multi-function programming device, antifuse operation may be further provided through application of an antifuse programming voltage between one or more end of fuse line 130 and substrate 105.

Fuse line 130 may be any conductive material, such as, but not limited to, polycrystalline silicon, doped polycrystalline silicon, polycrystalline germanium, doped polycrystalline germanium, polycrystalline silicon-germanium, or doped polycrystalline silicon-germanium. In advantageous embodiments, fuse line 130 includes one or more metal, such as, but not limited to tungsten, nickel, cobalt, aluminum, and titanium. For such metal embodiments, fuse line 130 may be substantially one metal with only trace impurities, or may include a laminate stack structure or compositional grading of a plurality of metals, or may be a homogenous alloy of such metals, or a laminate grading of alloyed metals, etc. In alloyed metal embodiments, one or more of metal-nitrides, metal-carbides, metal-silicides, and metal-germanides may be employed in fuse line 130.

Fuse line 130 includes a low-z portion 135 disposed between high-z portions 136, 137. Fuse line 130 has a longitudinal length $L_1$. Length $L_1$ may vary as needed for providing a pair of contact lands of length $L_C$. Line length $L_1$ is also a function of the desired fuse length $L_2$, which corresponds to low-z line portion 135. As such, fuse line length $L_1$ is a function of manufacturing capability with respect to minimum contact and contact spacing dimensions, which scale with manufacturing technology node. Following the below functional guidelines, fuse line 130 may have a length $L_1$ of anywhere between a minimum design rule (e.g., 0.1 µm, or less) to 5-10 µm, or more. Fuse line 130 has a minimum transverse width $W_1$ within low-z line portion 135. Minimum width $W_1$ may be anywhere between a minimum design rule (e.g., 10 nm, or less) up through a dimension of 150 nm, or more, typical of power supply lines. Fuse program current requirements correspond to a cross-sectional area of fuse line 130, and are therefore a function of minimum transverse width $W_1$. In advantageous embodiments, minimum width $W_1$ is less than a width $W_2$ of high-z portions 136, 137. For example, fuse line 130 may be have a "dog-bone" structure where $W_1$ is less than 90% of $W_2$, and more specifically between 50-80% of $W_2$. In one such embodiment, $W_1$ is no more than 50 nm. FIG. 1A illustrates an exemplary embodiment where transverse widths $W_1$ and $W_2$ approach minimum design rules and width varies continuously between $W_1$ and $W_2$, and more specifically tapers non-linearly (e.g., with curvature) as a function of lithographic and etch pattern transfer mechanisms.

Exemplary non-planarity of fuse line 130 along length $L_1$ is illustrated in FIG. 1B. High-z portions 136, 137 extend to a greater z-height ($H_H$) from substrate 105 than does low-z portion 135, which has a lowest fuse z-height $H_L$. The relative lengths of high-z portions 136, 137 and low-z portion 135 may vary with high-z portions 136, 137 being sufficient to provide contact land length $L_C$ as shown FIG. 1A. Low-z portion 135 may have a fuse length $L_2$ sufficient to provide desired spacing between interconnect contacts landed on high z-portions 136, 137. In the exemplary embodiment, z-height along low-z portion 135 varies from an intermediate fuse height $H_I$ to lowest fuse z-height $H_L$ (i.e., minimum thickness) along the longitudinal fuse length $L_2$. Lowest fuse z-height $H_L$ is approximately at the center of fuse length $L_2$. Fuse height variation between $H_I$ and $H_L$ may be gradual. For example, fuse height may be gradated over fuse length $L_2$ with a non-linear (curved) taper from a maximum fuse height (intermediate height $H_I$) proximate to each high-z portion 136, 137 to a minimum fuse height (lowest height $H_L$) there between. In exemplary embodiments, high-z portions 136, 137 have a high-z height $H_H$ between 50 nm and 200 nm, advantageously between 50 nm and 150 nm, and more advantageously no more than 100 nm. Within low-z portion 135, lowest z-height $H_L$ is less than high-z height $H_H$ by 50-90% of $H_H$. In one such embodiment where $H_H$ is no more than 100 nm, $H_L$ is less than 30 nm and advantageously less than 20 nm. Fuse program current, being a function of fuse cross-sectional area is dependent on fuse z-height $H_L$. As described further below, z-height $H_L$ may be controlled by an etch process.

As shown in FIGS. 1A, 1B, and 1C, a dielectric material 120 wraps completely around low-z portion 135. Dielectric material 120 is disposed between substrate 105 and a bottom surface 130B of fuse line 130. In the exemplary embodiment where substrate 105 is a crystalline semiconductor, fuse line 130 is separated from the crystalline semiconductor by dielectric material 120 and isolation dielectric material 106. In alternate embodiments, dielectric material 120 is the one intervening material between semiconductor and fuse line 130. Dielectric material 120 is further disposed adjacent to line sidewalls 130A and 130C, in addition to being disposed on top surface 130D of low-z portion 135. Dielectric material 120 may comprise one or more dielectric materials, either in the form of a homogenous composition or as a laminate film stack and/or graded composition. In embodiments, dielectric material 120 includes silicon dioxide, and/or silicon nitride, and/or silicon oxynitride, and/or a higher-K material that has a bulk relative dielectric constant above silicon nitride (e.g., at least 10). In advantageous high-K embodiments, dielectric material 120 includes a metal oxide, such as $HfO_2$, $TiO_2$, $ZnO_2$, or the like.

In embodiments, a dielectric material 150 is disposed over low-z portion 135, which electrically isolates high-z portions 136, 137. The non-planarity of fuse line 130 enables the top surface of fuse line 130 within high-z portions 136, 137 (e.g., top surface 130D in FIG. 1B) to be planar with a top surface of dielectric material 109 that surrounds a perimeter edge of fuse line 130, and to be planar with a top surface of dielectric material 150. This planarity in top surfaces of the fuse line ends is advantageous for subsequent interconnection with other circuitry integrated onto substrate 105. Another benefit of this structure is that the fuse melt location is well encapsulated deeply below dielectric material 150 (and surrounded by a similar thickness of dielectric material. This encapsulation along with substrate isolation dielectric 106 below, may minimize collateral IC damage. Dielectric material 150 may have any dielectric material composition as embodiments are not limited in this respect. For example silicon dioxide, silicon nitride, carbon-doped silicon dioxide, and other porous low-k materials are all suitable for dielectric material 150. Although for advantageous embodiments dielectric material 150 has a bulk relative dielectric constant below that of dielectric material 120, higher-k materials may also be utilized for dielectric material 120.

Figure 2A:
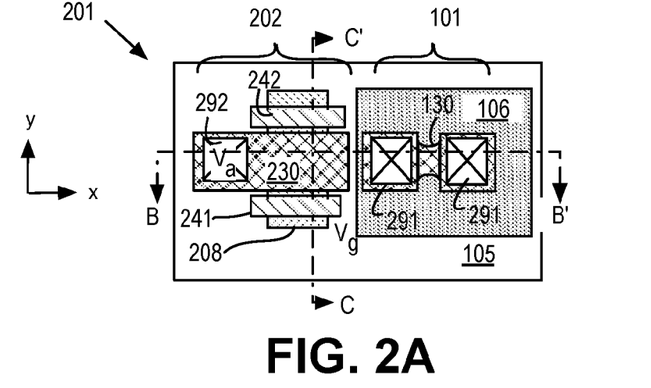
FIG. 2A is a plan view of an IC layout including a MOS transistor and an embedded fuse with a backfilled conductor, in accordance with embodiments.

FIG. 2A is a plan view of an IC layout including a MOS transistor 202 and embedded fuse 101, in accordance with embodiments. Fuse 101 and MOS transistor 202 are disposed over substrate 105 (e.g., semiconductor). MOS transistor 102 includes a gate terminal 230 patterned as a first stripe disposed over a first region of substrate 105 with a gate dielectric disposed there between. Embedded fuse 101 includes a fuse line 130 patterned as a second stripe disposed over a second (isolated) region of substrate 105 adjacent to the first stripe. In advantageous embodiments, fuse line 130 includes the same material(s) as gate terminal 230. In advantageous embodiments, the gate dielectric material disposed between gate terminal 230 and substrate 105 is further disposed between fuse line 130 and substrate 105 and wraps completely around a low-z portion of fuse line 130.

Figure 2B:
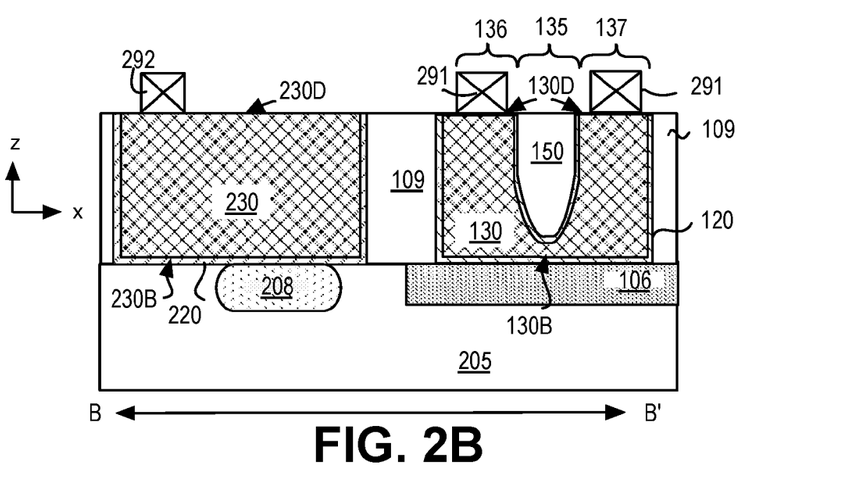
FIGS. 2B and 2C are cross-sectional views of the IC layout illustrated in FIG. 2A, in accordance with embodiments.
Figure 2C:
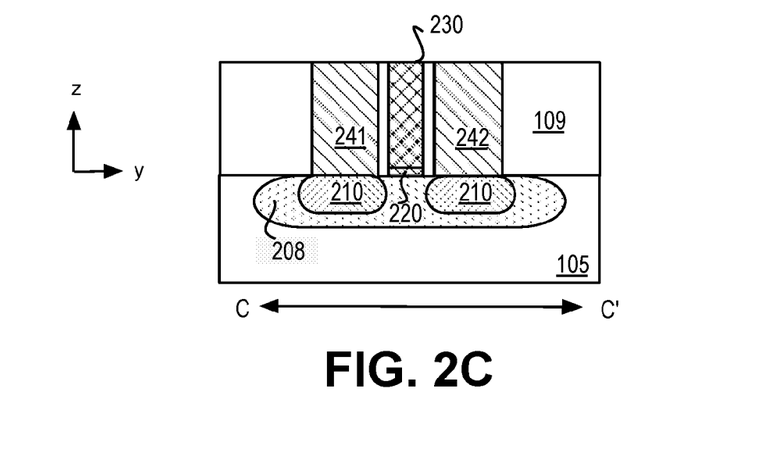

FIGS. 2B and 2C are cross-sectional views of the IC layout along the B-B' and C-C' lines illustrated in FIG. 2A, respectively. MOS transistor 202 is disposed over a doped semiconductor well 208. First and second source/drain contacts 241, 242 are disposed on opposite sides of gate terminal 230, and coupled to heavily doped source/drain semiconductor regions 210.

As further depicted in FIG. 2B, fuse line 130 includes high-z portions 136, 137 that have a top surface 130D planar with a top gate terminal surface 230D. Hence, fuse line 130 is a stripe having thick ends of a z-thickness equal to that of gate terminal 230, and a thin center of a z-thickness considerably less than that of gate terminal 230. In embodiments, fuse line 130 and gate terminal 230 are of the same metal(s). Fuse line 130 and gate terminal 230 are laterally separated by dielectric material 109.

Disposed between the first region of substrate 105 and gate terminal 230 is a gate dielectric material 220. Fuse line 130 further includes low-z portion 135 with dielectric material 120 wrapping completely around at least the low-z portion. In one such embodiment, gate terminal 230 has a bottom surface 230B substantially planar with a bottom surface of fuse line 130B. Dielectric material 150 is disposed over dielectric material 120 and the low-z line portion 135, as previously described. Where gate terminal 230 has a substantially planar top surface 230D, dielectric material 150 is absent from the top gate terminal surface 230D.

In advantageous embodiments where dielectric material 120 and gate dielectric material 220 are the same material(s), fabrication of embedded fuse 101 and MOS transistor 202 may be concurrent. For such embodiments herein therefore, fuse features are not relegated to larger geometries associated with upper level interconnects. In one advantageous embodiment, dielectric materials 120 and 220 both include a high-k dielectric material having a bulk relative dielectric constant greater than 9, and advantageously at least 10. The presence of dielectric material 120 need not merely be an artifact of integration with MOS transistor fabrication, but may be additionally leveraged to electrically isolate fuse 101 from semiconductor of substrate 105, reduce the conductive cross-sectional area of fuse 101, and/or provide a mechanical and thermal barrier completely around fuse 101. The dielectric film composition, as well as the high film quality and conformality associated with advanced gate dielectric deposition processes are advantageous to the embedded fuse architectures described herein.

Figure 3A:
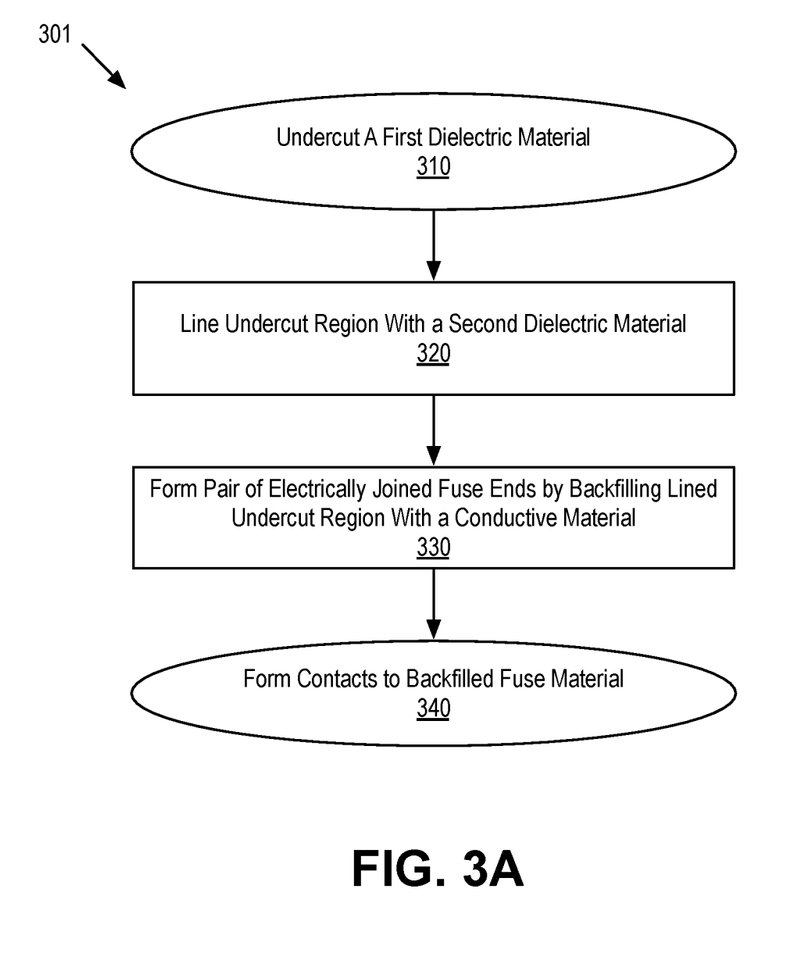
FIG. 3A is a flow diagram illustrating a method of forming an embedded fuse by backfilling a conductive material, in accordance with an embodiment.

An embedded fuse, as well as an IC incorporating both a MOS transistor and an embedded fuse, may be fabricated with a wide variety of techniques. FIG. 3A is a flow diagram illustrating one exemplary method 301 for forming an embedded fuse in accordance with one embodiment. Method 301 begins with operation 310 where a dielectric material layer is laterally undercut. As described further below, an isotropic etch process having high selectivity between the dielectric material and a sacrificial material may be utilized at operation 310. At operation 320, another dielectric material (e.g., a transistor gate dielectric material) is deposited to line the undercut region. A conformal deposition process, such as chemical vapor deposition (CVD) or atomic layer deposition (ALD), may be practiced at operation 320. At operation 330, the fuse line is formed by backfilling the dielectric-lined undercut region with a conductive material. A conformal deposition process such as CVD, or ALD, may be practiced at operation 330 to backfill the undercut region with any of the materials described above for fuse line 130 (e.g., a MOS transistor gate metal). The backfill may be planarized with the dielectric materials, leaving two opposite fuse ends electrically joined through the backfilled void. Method 301 then completes at operation 340 where contacts to the conductive backfill material are formed, for example with conventional fabrication techniques, to complete interconnection to the monolithic embedded fuse.

Figure 3B:
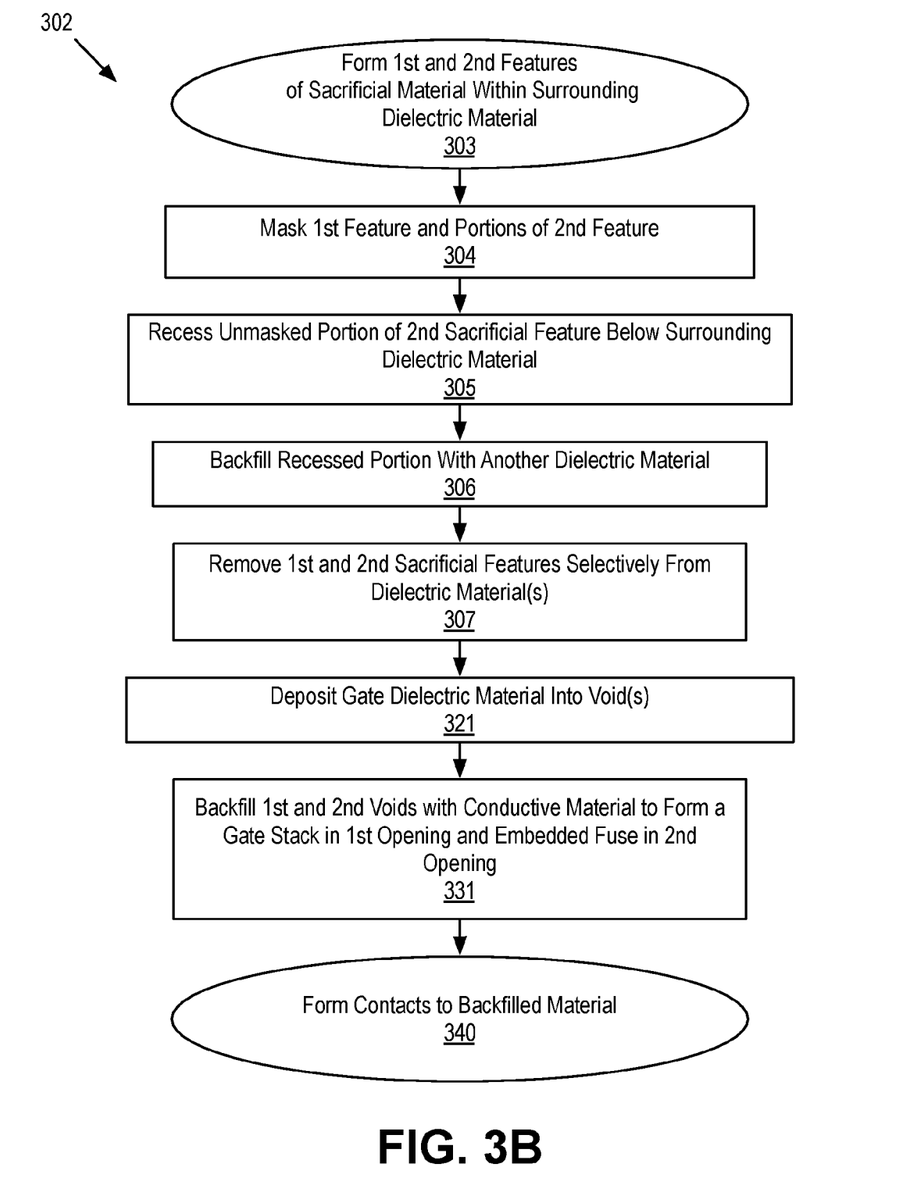
FIG. 3B is a flow diagram illustrating a method of forming an IC including an MOS transistor and an embedded fuse with conductor backfill, in accordance with an embodiment.

FIG. 3B is a flow diagram illustrating a method 302 for forming an IC with a MOS transistor and an embedded fuse with conductor backfill, in accordance with an embodiment. Method 302 may be considered a specific embodiment of the more general method 301. FIGS. 4A, 4B, 4C, 4D, 4E, 4F, and 4G are cross-sectional views of an evolving IC along the B-B' line depicted in FIG. 2B as selected operations in the method 302 are performed in accordance with an embodiment.

Figure 4A:
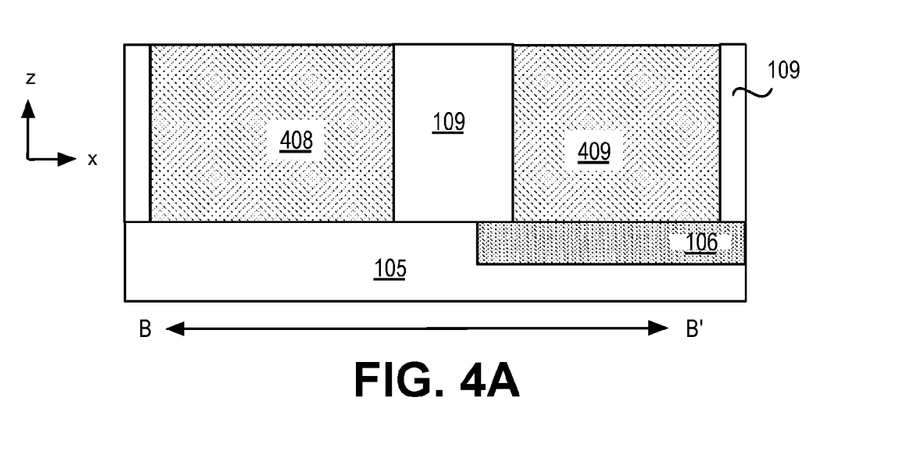
FIGS. 4A, 4B, 4C, 4D, 4E, 4F, and 4G are cross-sectional views of an IC including an MOS transistor and an embedded fuse evolving as selected operations in the method depicted in FIG. 3B are performed, in accordance with an embodiment.

Referring first to FIG. 3B, operations 303, 304, 305, 306 and 307 are performed as one specific embodiment of operation 310 in method 301 (FIG. 3A) that integrates well with "gate-last" MOS transistor fabrication. In this embodiment, a MOS transistor may be fabricated concurrently with an embedded fuse. Beginning with operation 303, first and second features of sacrificial material are provided within a surrounding dielectric material. The sequence for forming the sacrificial material and surrounding dielectric material may vary with either the sacrificial material or dielectric material being patterned into lines or openings. Referring to FIG. 4A, sacrificial material features 408 and 409 are embedded within a dielectric material 109 at the completion of operation 303. Sacrificial material feature 409 is further disposed over substrate isolation dielectric 106 in this exemplary embodiment. Any process known in the art may be utilized to form sacrificial material features 408, 409 planarized with surrounding dielectric material 109. In an exemplary embodiment, sacrificial material features 408, 409 include a polycrystalline semiconductor, such as, but not limited to, polysilicon. In one particular polysilicon embodiment, sacrificial polysilicon material features 408, 409 have a thickness (z-height) less than 150 nm and advantageously no more than 100 nm. In further embodiments, sacrificial features may include a top hardmask disposed over the bulk sacrificial material. Dielectric material 109 may be any conventional material, such as but not limited to silicon dioxide and/or silicon nitride.

Figure 4B:
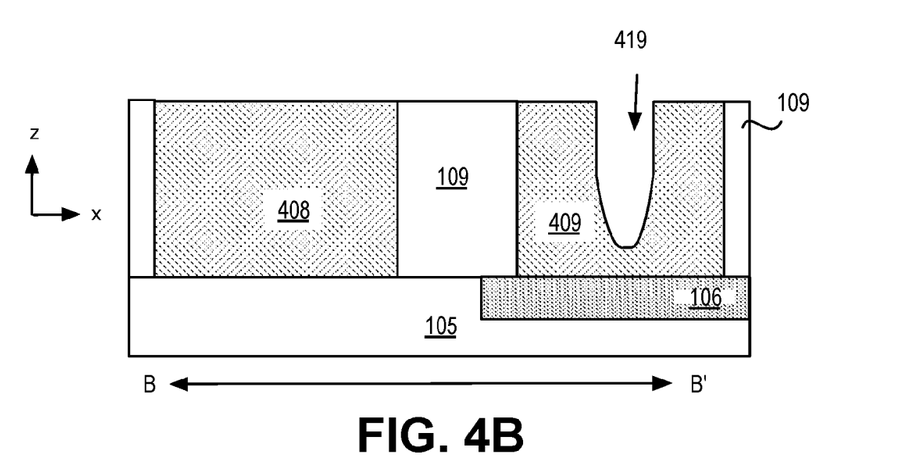

Returning to FIG. 3B, method 302 proceeds to operation 304 where a length of sacrificial material is masked. Any masking process may be utilized at operation 304, such as, but not limited to a hardmask process. In the exemplary embodiment, a first sacrificial feature is completely masked while only two end portions of the second sacrificial feature are masked. The unmasked center portion of the second sacrificial feature is then recessed below a top surface of the surrounding dielectric by an etch process performed at operation 305. As illustrated in FIG. 4B for example, a recess 419 is shown along a center portion of sacrificial feature 409. Operation 305 may include any anisotropic etch process selective to the surrounding dielectric, such as an anisotropic plasma (RIE) etch. At the recess etching operation 304, the thickness of the etched portion is reduced. The transverse width of the etched portion may also be reduced under certain etch process conditions. In embodiments 50-90% of the sacrificial material thickness may be removed at operation 304. In exemplary embodiments, a polysilicon sacrificial material having a thickness of 100-150 nm is thinned to less than 30 nm. In further embodiments, the transverse width of sacrificial material is reduced by 10-30%, or more. Additionally, where etch mask erosion is non-negligible, the partially-etched sacrificial feature 409 may develop a tapered z-height and/or transverse width profile along the longitudinal feature length during operation 304.

Figure 4C:
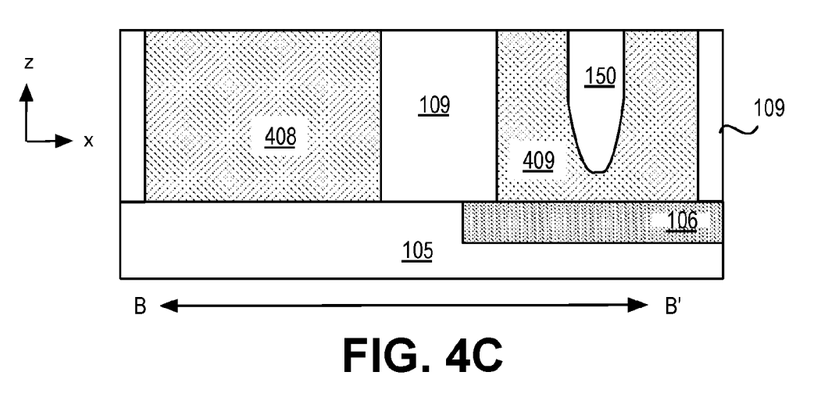
Figure 4D:
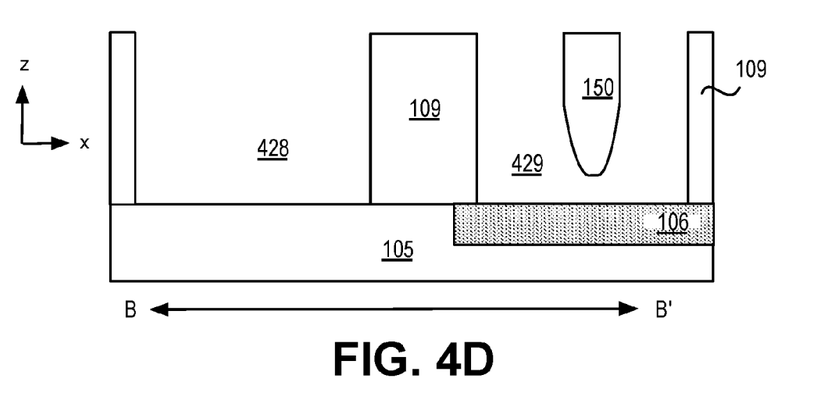
Figure 4E:
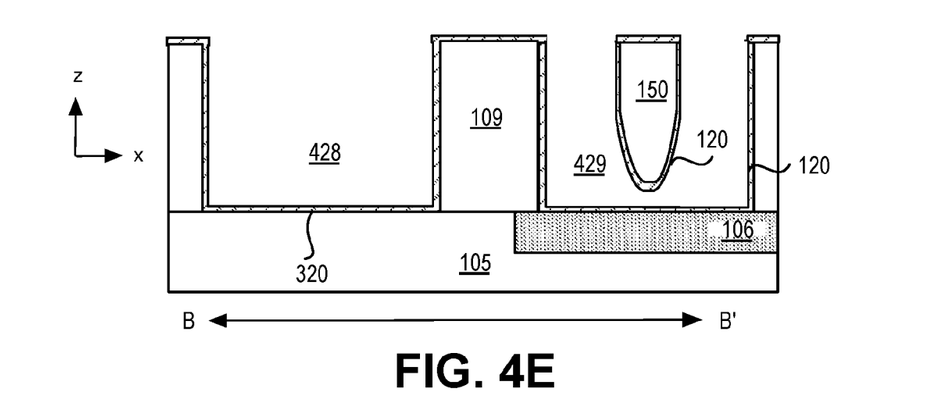

Returning to FIG. 3B, method 302 then proceeds to operation 306 where the recessed portion of the sacrificial feature is backfilled with another dielectric material. Any deposition (e.g., CVD) and planarization process (e.g., CMP) may be utilized at operation 306. FIG. 4C illustrates one embodiment where dielectric material 150 is backfilled over a portion of sacrificial feature 409. Dielectric material 150 is again planarized with dielectric material 109 and sacrificial feature 408 (and with high-z portion of sacrificial feature 409).

Method 302 (FIG. 3B) continues with operation 307 where the first and second sacrificial features are removed selectively relative to the surrounding dielectric material, including the dielectric material that was previously backfilled. In the exemplary embodiment illustrated in FIG. 4D, removal of sacrificial feature 408 leaves a first void 428. Removal of sacrificial feature 409 leaves a second void 429, which laterally undercuts dielectric material 150. Where the sacrificial material is polysilicon for example, a highly selective plasma etch and/or wet chemical etch may be utilized to completely clean out the sacrificial material even from below extensive dielectric overhangs. Precision patterning (recessing) of the sacrificial material at operation 305 may be leveraged at operation 307 to tightly control dimensions of voids 428, 429.

A pair of openings or voids are now present, with one void bridged by dielectric material 150. Method 302 proceeds to operation 321 where a gate dielectric material is deposited into the void(s) formed at operation 307. Any suitable gate dielectric deposition process may be employed at operation 321. In an exemplary embodiment, a CVD and/or ALD process is employed at operation 321 to deposit a high-k gate dielectric material (e.g., having a bulk relative dielectric constant of at least 10). As shown in the exemplary embodiment illustrated by FIG. 4E, a gate dielectric deposition process is employed to both line the first void 428 with gate dielectric material 320 and line the second void 429 with dielectric material 120. In other words, dielectric material 120 and gate dielectric material 320 have the same composition and are formed concurrently with one process, but have a different device functionality in the contexts of embedded fuse and MOS transistor.

Figure 4F:
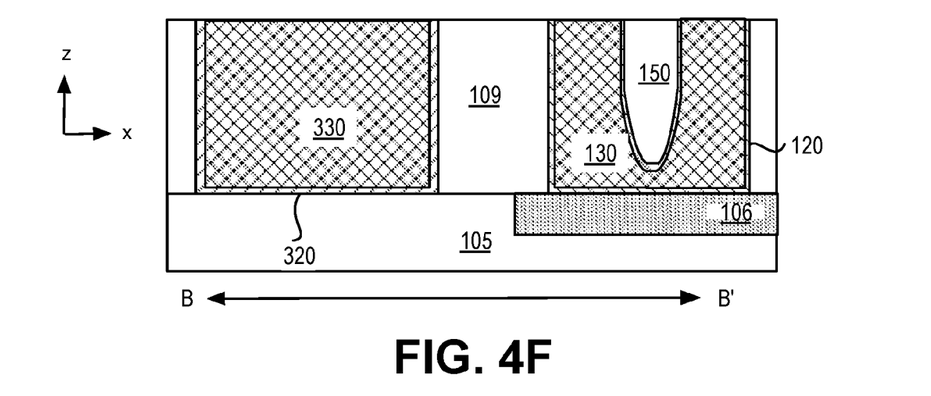

Returning to FIG. 3B, at operation 331, the voids are backfilled with conductive material to form a gate terminal in the first void and an isolated fuse line in the second void. In advantageous embodiments, voids with extensive undercut (overhang) may be completely backfilled with a highly conformal deposition process. A metal ALD process is utilized in one such embodiment. As shown in FIG. 4F for example, a metal ALD process backfills gate terminal 330 into void 428 concurrently with backfilling fuse line 130 into void 429. Any undercut region disposed below dielectric material 150 may be completely filled.

Figure 4G:
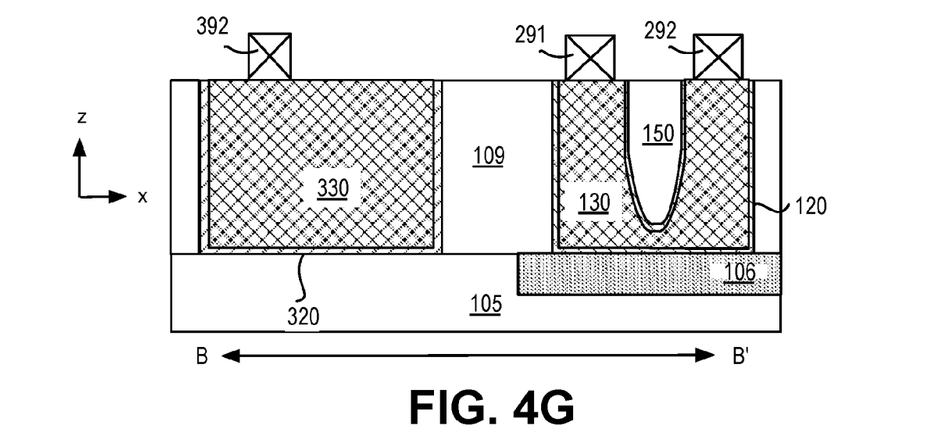

Method 302 then completes with conventional fabrication at operation 340 to complete an IC, for example concurrently forming a pair of fuse contacts 291, 292 at opposite ends of fuse line 130, and MOS gate terminal contact 392.

Figure 5:
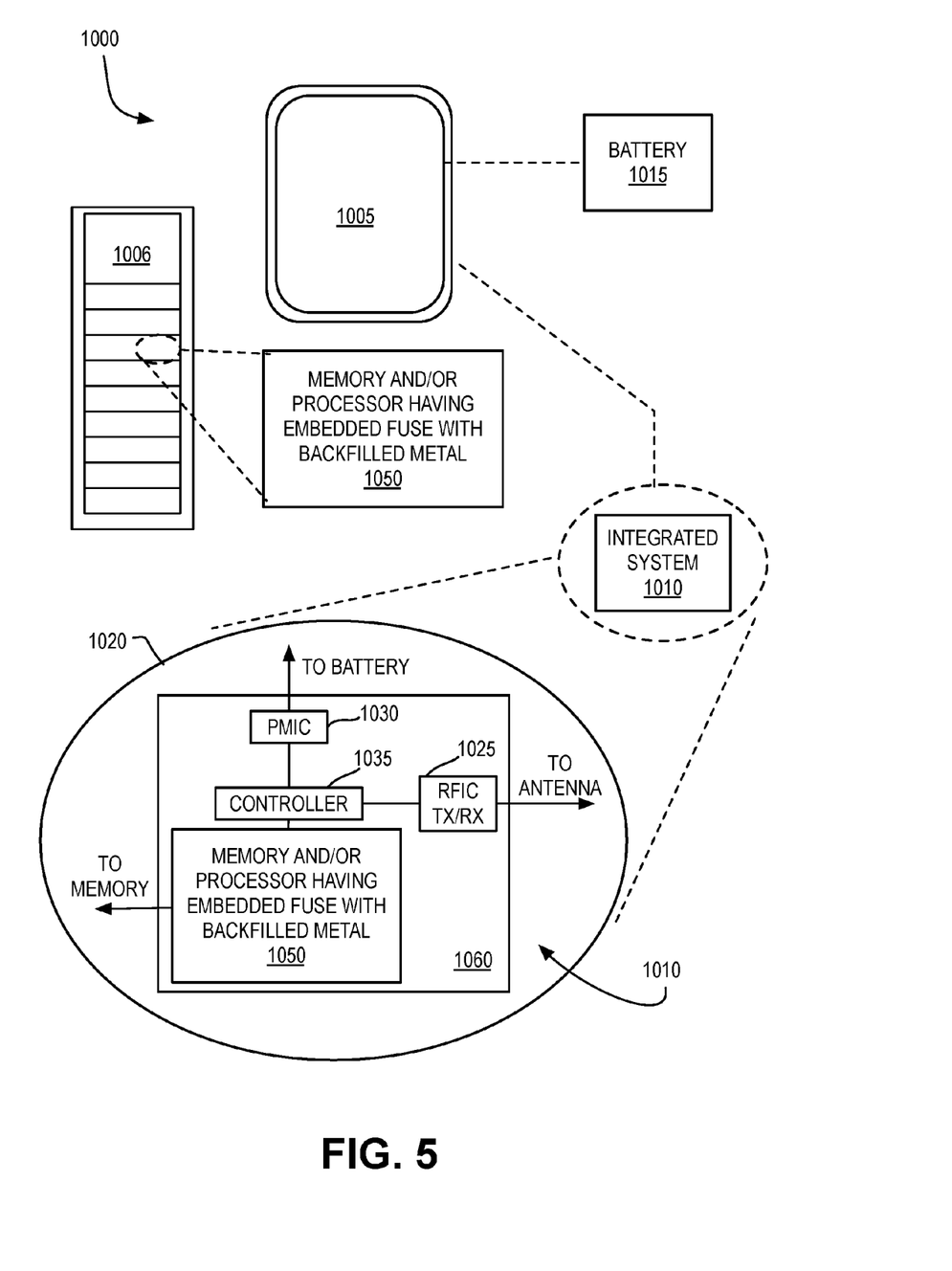
FIG. 5 illustrates a mobile computing platform and a data server machine employing an embedded fuse with conductor backfill in accordance with embodiments of the present invention.

FIG. 5 illustrates a system 1000 in which a mobile computing platform 1005 and/or a data server machine 1006 employs a monolithic embedded fuse with a backfilled metal line in accordance with embodiments of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a monolithic architecture with at least one embedded fuse with a backfilled metal line, for example as describe elsewhere herein. The monolithic IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 6:
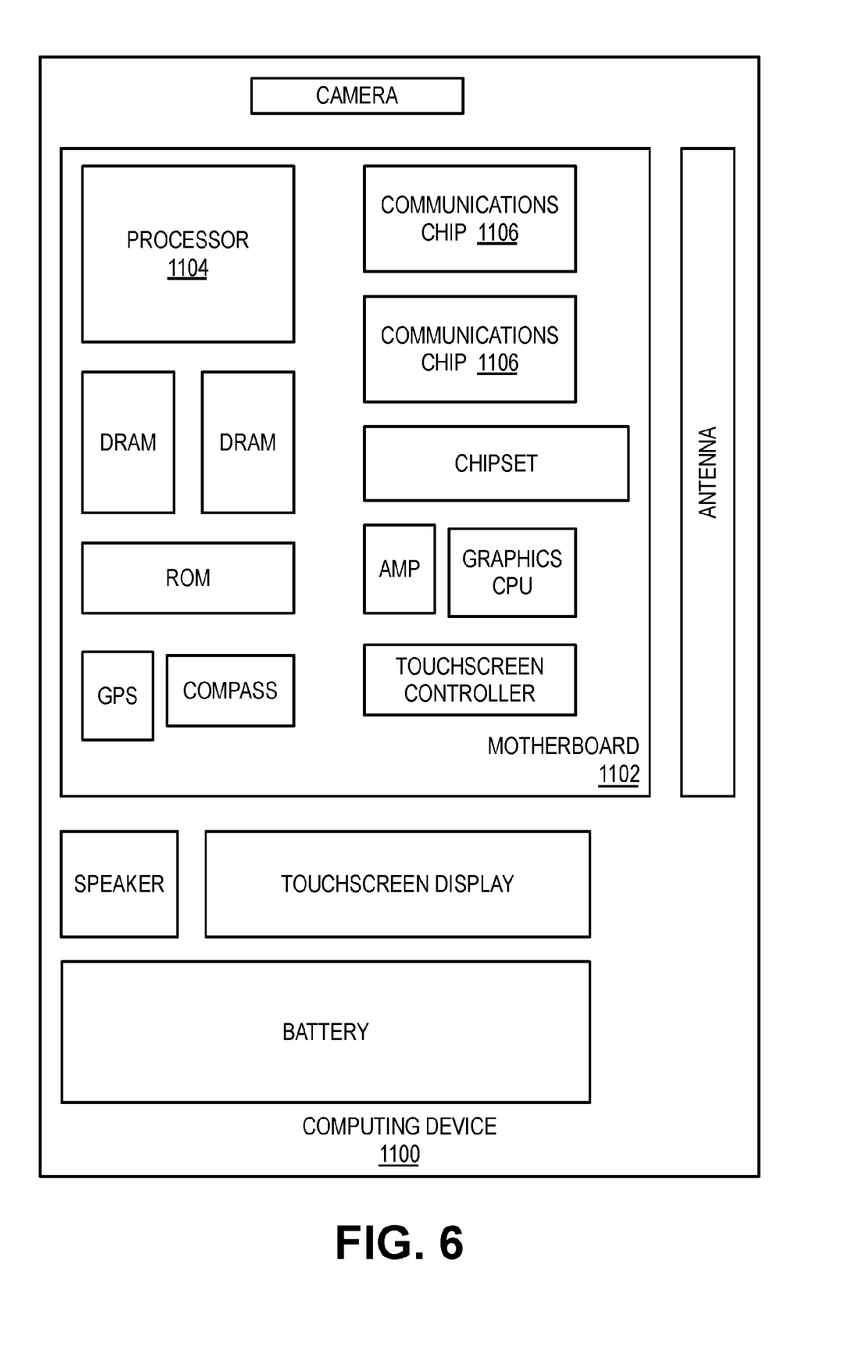
FIG. 6 is a functional block diagram of an electronic computing device, in accordance with an embodiment of the present invention.

FIG. 6 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate an embedded fuse with conductive backfill. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first embodiments, an embedded fuse includes a non-planar conductive line disposed over a substrate. The non-planar line has a low-z portion between two high-z portions that extend to a greater z-height from the substrate than does the low-z portion. A high-k dielectric material is disposed below the line and above the substrate, and a second dielectric material is disposed over the high-k dielectric material and the low-z line portion. The second dielectric material has a top surface planar with the high-z portions.

In furtherence of the one or more first embodiments, the substrate includes crystalline semiconductor. The non-planar line includes a metal. The high-k material wraps completely around the low-z portion and has a bulk relative dielectric constant of at least 10 and a thickness less than 10 nm. The second dielectric material has a bulk relative dielectric constant below that of the high-k dielectric material.

In furtherence of the one or more first embodiments, the substrate includes crystalline semiconductor, the non-planar line includes a metal separated from the crystalline semiconductor by the high-k dielectric material and an isolation dielectric embedded within the semiconductor. The non-planar line has a first thickness within the high-z portion greater than a second thickness within the low-z portion.

In furtherence of the one or more first embodiments, the low-z portion has a minimum z-height less than 30 nm.

In furtherence of the one or more first embodiments, the low-z portion has a minimum z-height less than 30 nm and a lateral width less than that of the high-z portions.

In furtherence of the one or more first embodiments, the low-z portion has a minimum z-height less than 30 nm and a lateral width no more than 50 nm.

In furtherence of any of the first embodiments, the low-z portion has a graduated z-height, the graduated z-thickness tapering from a maximum z-thickness proximate to each of the high-z portions to a minimum z-thickness there between.

In one or more second embodiments, an integrated circuit (IC) includes a MOS transistor with a gate terminal, further including a first metal, disposed over a first region of a semiconductor substrate with a gate dielectric material disposed there between. The IC also includes an embedded fuse further including a non-planar conductive line disposed over a second region of the substrate. The non-planar line has a low-z portion between two high-z portions that extend to a greater z-height from the substrate than does the low-z portion. The gate dielectric material is disposed between the line and the substrate and wraps completely around the low-z portion.

In furtherence of the one or more second embodiments, the non-planar line includes the first metal. The gate dielectric is a high-k material having a bulk relative dielectric constant of at least 10 and a thickness less than 10 nm.

In furtherence of the one or more second embodiments, the high-z portions have a top surface that is planar with a top surface of the gate terminal. The low-z portion has a minimum z-thickness less than 30 nm and a lateral width less than that of the high-z portions.

In one or more third embodiments, a method of fabricating an embedded fuse includes laterally undercutting a region of a first dielectric material disposed over a substrate. The method includes lining the undercut region with a second dielectric material. The method includes forming a pair of opposite fuse ends by backfilling the lined undercut region with a conductive material.

In furtherance of the one or more third embodiments, laterally undercutting the first dielectric material further includes forming a non-planar length of sacrificial material over the substrate. The non-planar length has a low-z portion between two high-z portions. The high-z portions extend to a greater z-height from the substrate than does the low-z portion. The lateral undercutting the first dielectric material further includes depositing the first dielectric material over the non-planar length, planarizing the first dielectric material with the high-z portion, and etching the sacrificial material selectively from the first dielectric material.

In furtherance of the one or more third embodiments, laterally undercutting the first dielectric material further includes forming a non-planar length of sacrificial material over the substrate. The non-planar length has a low-z portion between two high-z portions. The high-z portions extend to a greater z-height from the substrate than does the low-z portion. Forming the non-planar length of sacrificial material further includes depositing the sacrificial material to a uniform thickness equal to the greater z-height, masking the high-z portions of the sacrificial material, and recessing the low-z portion of the sacrificial material to a lesser thickness. The low-z portion is backfilled with the first dielectric material, and the sacrificial material is etched selectively from the first dielectric material.

In furtherance of the one or more third embodiments, laterally undercutting the first dielectric material further includes forming a non-planar length of sacrificial material over the substrate. The non-planar length has a low-z portion between two high-z portions. The high-z portions extend to a greater z-height from the substrate than does the low-z portion. Forming the non-planar length of sacrificial material further includes patterning an opening in either the sacrificial material layer or a surrounding dielectric material, backfilling the opening in the surrounding dielectric material with the sacrificial material or backfilling the opening in the sacrificial material with the surrounding dielectric material, masking the high-z portions of the sacrificial material, and recessing the unmasked sacrificial material below a top surface of the surrounding dielectric material to form the low-z portion. The low-z portion is backfilled with the first dielectric material, and the sacrificial material is etched selectively from the first dielectric material.

In furtherance of the one or more third embodiments, a second feature of the sacrificial material is also formed over the substrate, with a first dielectric material between the first and second features. The second feature is masked (completely) while masking the high-z portions of the first feature. The second sacrificial material feature is removed along with the first feature. The second dielectric material is also deposited into a second void resulting from removing the second sacrificial material. Along with the embedded fuse terminals, a gate terminal is formed by backfilling the second void with the conductive material.

In furtherance of any of the one or more third embodiments, lining the undercut region of the first dielectric material with the second dielectric material further includes depositing, with a chemical vapor deposition (CVD) or atomic layer deposition (ALD) process, a high-k dielectric material having a bulk relative dielectric constant of at least 10. Backfilling the lined undercut region with the conductive material further includes depositing a metal with an ALD process.

In one or more fourth embodiment, a method of forming an integrated circuit (IC) includes forming a first feature of sacrificial material over a first region of a substrate and a second feature of sacrificial material over a second region of the substrate, with a first dielectric material there between. The method includes masking the first feature and first portions of the second feature. The method includes recessing an unmasked portion of the second feature below a top surface of the first dielectric material. The method includes backfilling the recessed portion of the second feature with a second dielectric material. The method includes removing the first and second sacrificial material features selectively from the first and second dielectric materials. The method includes depositing a gate dielectric material into first and second voids, and backfilling the first and second voids with a conductive material to form one gate terminal over the first substrate region and an embedded fuse over the second substrate region.

In furtherance of the one or more fourth embodiments, removing the second sacrificial material feature undercuts the second dielectric material. Depositing the gate dielectric material lines the undercut. Backfilling the voids with the conductive material fills the undercut.

In furtherance of any of the one or more fourth embodiments, depositing the gate dielectric material further comprises depositing, with a chemical vapor deposition (CVD) or atomic layer deposition (ALD) process, a high-k dielectric material having a bulk relative dielectric constant of at least 10. Backfilling the voids further includes depositing a metal with an ALD process.

In furtherance of any of the one or more fourth embodiments, the method includes forming a first contact to the gate terminal, and forming first and second contacts over the fuse.

In furtherance of any of the one or more fourth embodiments, recessing the unmasked portion of the second feature below a top surface of the first dielectric further comprises etching the sacrificial material to reduce its thickness to below 30 nm.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An embedded fuse structure, comprising a non-planar conductive line over a substrate, the non-planar line having a low-z portion between two high-z portions that extend to a greater z-height from the substrate than does the low-z portion, wherein the low-z portion has a graduated z-height that tapers from a maximum z-height proximate to each of the high-z portions to a minimum z-height therebetween, wherein:
   the line is over a high-k dielectric material; and
   the low-z portion is under a second dielectric material that has a top surface planar with the high-z portions.

2. The embedded fuse structure of claim 1, wherein:
   the substrate comprises crystalline semiconductor;
   the non-planar line comprises a metal;
   the high-k material wraps completely around the low-z portion and has a bulk relative dielectric constant of at least 10 and a thickness less than 10 nm; and
   the second dielectric material has a bulk relative dielectric constant below that of the high-k dielectric material.

3. The embedded fuse structure of claim 1, wherein:
   the substrate comprises crystalline semiconductor;
   the non-planar line comprises a metal separated from the crystalline semiconductor by the high-k dielectric material and an isolation dielectric embedded within the semiconductor; and
   the non-planar line has a first thickness within the high-z portion greater than a second thickness within the low-z portion.

4. The embedded fuse structure of claim 1, wherein the low-z portion has a minimum z-height less than 30 nm.

5. The embedded fuse structure of claim 1, wherein the low-z portion has a minimum z-height less than 30 nm and a lateral width less than that of the high-z portions.

6. The embedded fuse structure of claim 1, wherein the low-z portion has a minimum z-height less than 30 nm and a lateral width no more than 50 nm.

7. An integrated circuit (IC) structure, comprising:
   a MOS transistor with a gate terminal including a first metal over a first region of a semiconductor substrate with a gate dielectric therebetween; and
   an embedded fuse further comprising:
      a non-planar conductive line over a second region of the substrate, the non-planar line having a low-z portion between two high-z portions that extend to a greater z-height from the substrate than does the low-z portion, wherein the gate dielectric material is between the line and the substrate and wraps completely around the low-z portion.

8. The IC structure of claim 7, wherein:
   the non-planar line comprises the first metal; and
   the gate dielectric is a high-k material having a bulk relative dielectric constant of at least 10 and a thickness less than 10 nm.

9. The IC structure of claim 7, wherein:
the high-z portions have a top surface that is planar with a top surface of the gate terminal; and
the low-z portion has a minimum z-thickness less than 30 nm and a lateral width less than that of the high-z portions.

10. The embedded fuse structure of claim 1, wherein the high-k dielectric material is also between the second dielectric material and the low-z portion.

11. The embedded fuse structure of claim 1, wherein the high-k dielectric material has a dielectric constant of at least 10, and the second dielectric material has a bulk relative dielectric constant below that of the high-k dielectric material.

12. The embedded fuse structure of claim 1, wherein the low-z portion has a lateral width less than that of the high-z portions.

13. The embedded fuse structure of claim 1, wherein the high-k dielectric material wraps around both the low-z and high z-portions.

14. The embedded fuse structure of claim 1, wherein a first of the high-z portions is in contact with a first contact metallization, and a second of the high-z portions is in contact with a second contact metallization.

15. An embedded fuse structure, comprising:
a non-planar conductive line over a substrate, the non-planar line comprising a metal having a low-z portion between two high-z portions that extend to a greater z-height from the substrate than does the low-z portion;
a high-k dielectric material below the line, above the substrate, and wrapping completely around the low-z-portion; and
a second dielectric material over the high-k dielectric material and the low-z portion, the second dielectric material having a top surface planar with the high-z portions.

16. The embedded fuse structure of claim 15, wherein the low-z portion has a graduated z-height, the graduated z-height tapering from a maximum z-height proximate to each of the high-z portions to a minimum z-height therebetween.

17. The embedded fuse structure of claim 15, wherein the high-k dielectric material has a dielectric constant of at least 10, and the second dielectric material has a bulk relative dielectric constant below that of the high-k dielectric material.

18. The embedded fuse structure of claim 15, wherein:
the high-k dielectric material wraps around the high z-portions;
a first of the high-z portions is in contact with a first contact metallization, and a second of the high-z portions is in contact with a second contact metallization.

19. An integrated circuit (IC) structure, comprising:
a MOS transistor with a gate terminal, including a first metal over a first region of a semiconductor substrate with a gate dielectric material therebetween; and
an embedded fuse further comprising:
a non-planar conductive line over the gate dielectric material within a second region of the substrate, the non-planar line having a low-z portion between two high-z portions that extend to a greater z-height from the substrate than does the low-z portion, wherein the low-z portion has a graduated z-height, the graduated z-height tapering from a maximum z-height proximate to each of the high-z portions to a minimum z-height therebetween, wherein the non-planar conductive line comprises the first metal, and wherein the high-z portions have a top surface that is planar with a top surface of the gate terminal.

* * * * *